(12) United States Patent
Hagenauer et al.

(10) Patent No.: US 6,377,610 B1
(45) Date of Patent: Apr. 23, 2002

(54) DECODING METHOD AND DECODING DEVICE FOR A CDMA TRANSMISSION SYSTEM FOR DEMODULATING A RECEIVED SIGNAL AVAILABLE IN SERIAL CODE CONCATENATION

(75) Inventors: Joachim Hagenauer, Seefeld; Rupert Herzog, Eiselfing; Andreas Schmidbauer, Munich, all of (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/036,207

(22) Filed: Mar. 6, 1998

(51) Int. Cl.$^7$ ................................................ H04B 1/69
(52) U.S. Cl. ..................................................... 375/136
(58) Field of Search .............................. 375/130, 146, 375/147, 136

(56) References Cited

U.S. PATENT DOCUMENTS

| | | | | |
|---|---|---|---|---|
| 5,224,122 A | * | 6/1993 | Bruckert | 370/209 |
| 5,392,771 A | * | 2/1995 | Mock et al. | |
| 5,442,627 A | * | 8/1995 | Viterbi et al. | 375/146 |
| 5,550,810 A | * | 8/1996 | Monogioudis et al. | |
| 5,689,234 A | * | 11/1997 | Stumberg et al. | |
| 5,721,745 A | * | 2/1998 | Hladik et al. | 714/792 |
| 5,721,746 A | * | 2/1998 | Hladik et al. | 714/755 |
| 5,738,092 A | * | 4/1998 | Mock et al. | |

FOREIGN PATENT DOCUMENTS

| | | |
|---|---|---|
| DE | 39 10 739 C2 | 10/1990 |
| DE | 39 10 739 C3 | 10/1990 |
| DE | 39 10 739 A1 | 10/1990 |
| DE | 39 11 999 | * 10/1990 |
| DE | 42 43 666 | * 6/1994 |
| DE | 43 16 939 | * 11/1994 |
| DE | 44 10 952 | * 10/1995 |
| DE | 44 29 585 | * 11/1995 |
| DE | 41 93 229 | * 3/1996 |
| DE | 07 11 044 | * 5/1996 |
| DE | 44 37 984 | * 8/1996 |
| DE | 296 20 650 | * 4/1997 |
| DE | 197 42 758 | * 8/1998 |
| EP | 0 701 343 | * 3/1996 |
| EP | 0 735 696 | * 10/1996 |
| EP | 0 801 368 | * 10/1997 |
| WO | 96/27251 | * 9/1996 |

OTHER PUBLICATIONS

Hagenauer, "Forward Error Correcting for CDMA Systems", Proceedings of ISSSTA '95 International Symposium on Spread Spectrum Techniques and Applications, Mainz, Germany, vol. 2, Sep. 1996, pp. 566–567.*

(List continued on next page.)

Primary Examiner—Chi Pham
Assistant Examiner—Kevin M Burd
(74) Attorney, Agent, or Firm—Kenyon & Kenyon

(57) ABSTRACT

A method and a device for decoding for use in a code-division multiple access (CDMA) transmission system for demodulating a received signal available in serial code concatenation, with a two-step coding being carried out at the transmitting end of the transmission system, including an orthogonal, multi-step inner Hadamard code and an outer, error-correcting code of a predefined rate. In the receiver, a soft-in/soft-out decoder is provided, at whose input and output soft values are processed as reliability information, i.e., L-values. The soft output of the first decoder step, or inner code is the soft input for the decoder step, or outer code, that follows in each case, the first decoder step receiving the output values of the preceding demodulation, which contain the channel's reliability information. A soft output is used by the decoder, in particular a MAP decoder, as a-priori information for the systematic bits of the Walsh function of the inner code for decoding of the inner code.

4 Claims, 9 Drawing Sheets

OTHER PUBLICATIONS

Hagenauer et al., "Iterative Decoding of Binary Block and Covolutional Codes," IEEE Transactions of Information Theory, vol. 42, No. 2, Mar. 1996, pp. 429–445.*

In the Proc. IEEE International Conference on Communication (ICC), Genvea, Switzerland, pp. 1064–1070, May 1993.

Gabler, W., "Persönliche–Schutzausrüstung im Spiegel der A +A 97," Brandschutz/Deutsche Feuer–wehr–Zeitung, Mar. 1998.

JP 4–322669 A., Patents Abstracts of Japan, C–1041, Mar. 29, 1993, vol. 17, No. 158.

Hagenauer, J., "Forward Error Correcting for CDMA Systems," Proceedings of ISSSTA '95 International Symposium on Spread Spectrum Techniques and Applications, Mainz, Germany, vol. 2, Sep. 1996, pp. 566–569.

Battail, G., "Pondération des symboles décodés par l'algorithme de Viterbi," Ann Télécommunication, 1987, Bd. 42, Nr.1–2, pp. 31–38.

Jung, P., Abstract of "Comparison of Turbo–code Decoders Applied to Short Frame Transmission," IEEE Journal on Selected Areas in Communications, vol. 14, No. 3, Apr. 1996, pp. 503–537.

Benthin, M., et al., "Viterbi Decoding of Convolutional Codes with Reliability Information for a Noncoherent RAK-E–Receiver in a CDMA–Environment," IEEE Journal, 1994, pp. 1758–1762.

Hagenauer,J., et al., "Iterative Decoding of Binary Block and Convolutional Codes," IEEE Transactions of Information Theory, vol. 42, No. 2, Mar. 1996, pp. 429–445.

Proakis,J.G., "Digital Communications," $2^{nd}$ ed., McGraw–Hill Book Company, New York, 1989, pp. 454–463.

* cited by examiner

DECODING METHOD AND DECODING DEVICE FOR A CDMA TRANSMISSION SYSTEM FOR DEMODULATING A RECEIVED SIGNAL AVAILABLE IN SERIAL CODE CONCATENATION

FIELD OF THE INVENTION

The invention relates to a decoding method for a CDMA [code-division multiple access] transmission system for demodulating a received signal available in serial code concatenation, a two-step coding being carried out at the transmitting end of the transmission system, including an orthogonal, multi-step modulation and an external error-correcting code of a predefined rate according to the definition of the species in claim 1, as well as to a device for implementiiod according to claim 13.

BACKGROUND INFORMATION

Transmission systems having an internal code, naamely orthogonal modulation using Walsh functions or rows of the Hadamard matrix as code words, and an external code, for example a hash [convolution] code with interleavers [interleave factors] are known in decoding methods. One simple concept entails decoding the internal code in accordance with the "maximum likelihood" principle, and decoding the external code using a Viterbi algorithm (soft-in, hard-decision out) (Proakis, J. G. Digital Communications, 2nd edition, New York, McGraw-Hill, 1989).

The next, best step involves improving the decoding of the internal code and in employing a "symbol-by-symbol" MAP decoder (the decoding of the external code remains unchanged thereby), the algorithms for this, both for a coherent receiving plan, as well as for an incoherent receiving plan, being generally known.

The German Patent 39 10 739 C3 describes a method for generalizing the Viterbi algorithm and, for this purpose, a device for receiving signals transmitted via an interfered channel, where, in a incremental metrics unit (TMU), the transitional costs are generated, and addition [summing], comparison, and selection [processes] are subsequently carried out, and the differential costs of two incoming paths are calculated.

In the Proc. IEEE International Conference on Communication (ICC), Geneva, Switzerland, pp. 1064–1070, May 1993, Berrou proposes decoding the parallel concatenated codes in an iterative [process].

TECHNICAL OBJECT

The object of the invention is to improve upon the method according to the defined species, so as to enable an existing signal format to be decoded on the receiver side of a transmission system more efficiently and with less likelihood of bit errors than is possible with known methods heretofore, so that by using a downstream decoder circuit, the two-step, serially concatenated coding is decoded as optimally as possible and with the least possible outlay.

DETAILED DESCRIPTION OF THE INVENTION AND ITS ADVANTAGES

In the method according to the present invention, a soft-in/soft-out decoder is used in the receiver, at whose input and output, soft values are processed as reliability information (L values), the soft output of the first decoder step (internal code) being the soft input for the decoder step (external code) that follows in each case, and the first decoder step receiving the output values of the preceding demodulation, which contains the channel's reliability information.

Thus, the methods of iterative decoding can advantageously be applied to a CDMA system having orthogonal modulation as an internal code and a hash code (inclusive of interleavers) as an external code, thus within a system having serial code concatenation.

At the core of iterative decoding is the decoding instruction for the internal code. In this context, the decoding instructions must be expanded to enable use of a-priori information about the symbols to be decoded. Moreover, the external "hard decision" Viterbi decoder is replaced by a "soft decision" Viterbi algorithm, ieby a MAP algorithm having a "soft decision" output for the coded bits, to obtain the a-priori information for the renewed decoding.

In another embodiment of the method, a soft output is used by a decoder, in particular a MAP decoder, as a-priori information for the systematic bits of the Walsh function of the internal code for decoding of the same. To enhance the reliability of the decisions of the internal decoder, a feedback (iterative decoding) from the external to the internal decoder can be performed at least once, and the decisions (extrinsic information) of the second, external decoder about the systematic bits of the code words of the internal code, for example of the Walsh functions, can be fed back as a-priori information to the input of the first, internal decoder.

The a-priori information for the systematic bits of the code words of the internal code, for example of the Walsh functions, are likewise made available to the internal MAP decoder (maximally a posteriori) as reliability values in vector $L(u)$, and the decoder supplies, as a result, the L-values for estimated symbols $L(\hat{u})$, the amount $|L(\hat{u}_k)|$ of the L-values indicating the reliability of the decision and the operational sign($L(\hat{u}_k)$) of the L-values representing the hard decision. In the coherent receiver structure, the internal MAP decoder calculates, starting from the input vector ($L_c \cdot y$) having a specific reliability ($L_c$) and [from] the a-priori vector $L(u)$, as a decoder result, the weighted decision (L-values, $L(\hat{u}_k)$) for the estimated symbols, as well as the extrinsic term ($L_e(\hat{u}_k)$) of the L-values.

In the coherent receiver structure, to decode the internal Hadamard code, the vector of a-priori values ($L(u)$) for the systematic bits is added to the vector of reliability values ($L_c \cdot y$) from the channel and, after that, a fast Hadamard transformation (FHT) follows; subsequently, with the signals (vector w), the exponential functions are generated with ½·wj as an argument, after which, the elements of the result vector (z) for each symbol ($\hat{u}_K$) to be decoded are added, divided and expressed logarithmically, according to the equation:

$$\ln \frac{\sum\limits_{j, u_k=+1}^{N-1} z_j}{\sum\limits_{j, u_k=-1}^{N-1} z_j} = \ln \frac{\sum\limits_{j, u_k=+1}^{N-1} \exp\left(\frac{1}{2} w_j\right)}{\sum\limits_{j, u_k=-1}^{N-1} \exp\left(\frac{1}{2} w_j\right)}$$

$$= \ln\left(\overbrace{\sum\limits_{j, u_k=+1}^{N-1} \exp\left(\frac{1}{2} w_j\right)}^{\text{Term 1}}\right) - \ln\left(\overbrace{\sum\limits_{j, u_k=-1}^{N-1} \exp\left(\frac{1}{2} w_j\right)}^{\text{Term 2}}\right)$$

$$\approx \ln\left(\max_{j, u_k=+1}\left[\exp\left(\frac{1}{2} w_j\right)\right]\right) - \ln\left(\max_{j, u_k=-1}\left[\exp\left(\frac{1}{2} w_j\right)\right]\right)$$

-continued $$= \frac{1}{2} \max_{j, u_k = +1} [w_j] - \frac{1}{2} \max_{j, u_k = -1} [w_j].$$

The decoder result for bit (ûhd k) is made up of three terms, namely of the a-priori information [L(u$_k$)] about the bit to be decoded, of the channel information [L$_c$·y$_{sys(k)}$] about the bit to be decoded, as well as of the extrinsic information [L$_e$(û$_k$)], in which the channel and a-priori information of all other bits of vector (y) or of the transmitted Walsh function are combined.

In the incoherent receiver structure, the internal MAP decoder calculates, starting from the input vector (w) and the a-priori vector (L(u)), as a decoder result, the weighted decision (L-values, L(û$_k$) for the estimated symbols, as well as the extrinsic term (L$_e$(û$_k$) of the L-values.

In the incoherent receiver, to decode the internal Hadamard codes, the a-priori information (L(u)), for example in the form of a-priori probabilities P(x$_j$) for the Walsh functions, enters into the decoder instruction, which is such that for each bit decision, multiplied into the summing of numerator or denominator of the term to be expressed logarithmically of each considered element of the decision vector (w), are three terms, since there are the a-priori probabilities P(x$_j$), the exponentiated vector element, as well as the modified Bessel function to the first type of power (L−1) with argument.

A device for implementing the method is characterized by a soft-in/soft-out decoder in the receiver, at whose input and output, soft values are processed as reliability information (L-values), the soft output of the first decoder step (internal code) being in each case the soft input for the subsequent decoder step (external code), and the first decoder step receiving the output values of the preceding demodulation, which contains the reliability information of the channel. To enhance the reliability of the decisions of the internal decoder, a feedback (iterative decoding) from the external to the internal decoder is performed at least once, the decisions (extrinsic information) of the second, external decoder about the systematic bits of the code words of the internal code, for example of the Walsh functions, being fed back as a-priori information to the input of the first, internal decoder. In the process, a RAKE receiver can be arranged before [upstream from] the first decoder step, which receives the output values of the preceding demodulation.

In a two-step decoding, the quality of the first decoder output is decisive for the performance of the entire system. For this reason, it is indispensable that the reliability values be processed at the input and output of the first decoder step, which is why a MAP decoder is used as a decoder, which is used as a-priori information for the systematic bits of the Walsh function of the internal code for decoding of the same. Thus, the decoder must be able to process so-called soft values (L values) at the input and output of the decoder.

Figure 1A:
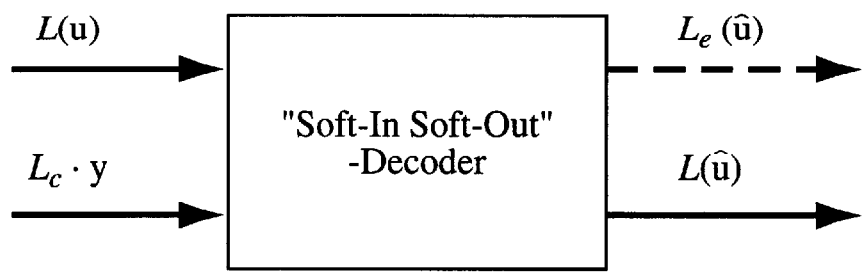
FIG. 1a a block diagram of a "soft-in/soft-out" decoder.
Figure 1B:
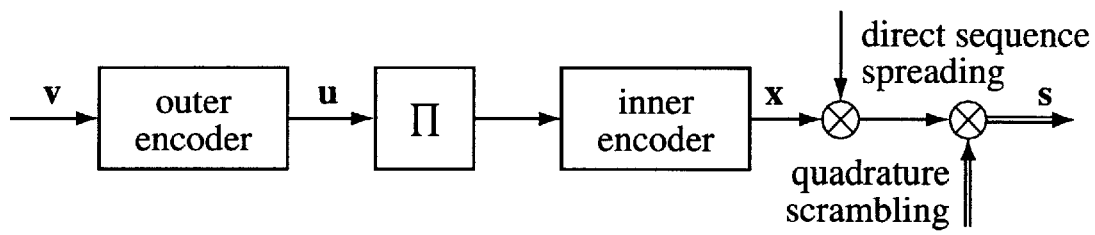
FIG. 1b a block diagram of a CDMA transmitter.

To further improve the decoding [process], e.g., by feeding back the decisions of the second decoder step, the decoder of the first step is, moreover, to be expanded to include a-priori information about the receiving vector, or parts of the receiving vector in the decoding according to the block diagram of a "soft-in/soft-out" decoder according to FIG. 1. Thus, for iterative decoding, it is necessary to replace the external Viterbi decoder with a modified soft-output Viterbi algorithm or with a MAP decoder, which supplies soft information for the coded bits. The soft output of the first decoder step is, in each case, the soft input for the subsequent Viterbi decoder with hard decisions at its output. As input values, denoted by the vector y, the first decoder step receives the integrated values after the long PN sequence is added.

Figure 2:
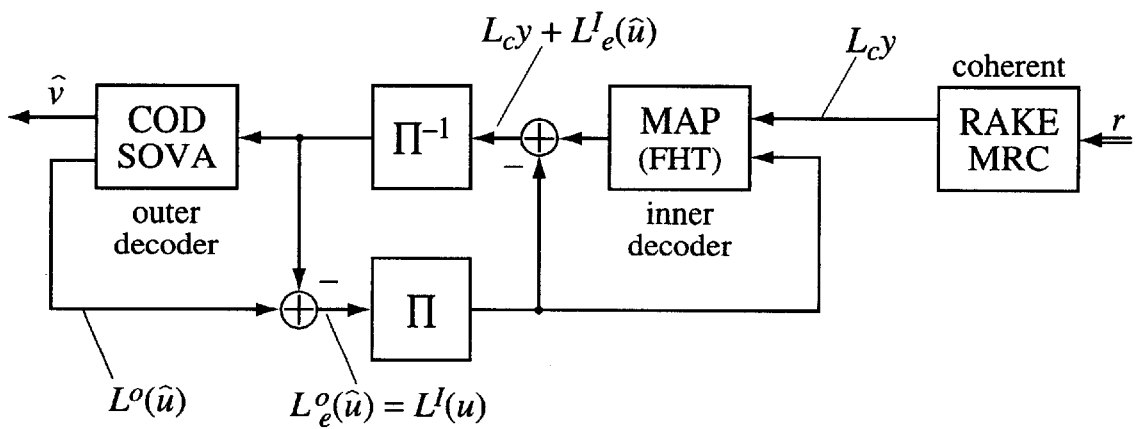
FIG. 2a representation of the iterative decoding, and of the decoder structure with feedback for a coherent receiver.

At this point, the information of the external decoder step is interleaved according to FIG. 2, and fed back as a-priori information for the second decoding of the internal code, which leads to a serial "turbo" decoding scheme; FIG. 2 shows a representation of the decoder structure, with feedback, for a coherent receiver, time-delay elements and storage locations [memory elements] having been omitted.

From a receiver, e.g., an L-finger RAKE receiver, one obtains the vector y of the length N for each transmitted Walsh function x having systematic bits u$_k$, k=0, . . . K−1. The probability density function of each element of vector y is a Gaussian normal distribution having average values E$_s$ or −E$_s$ and the variance [mean square deviation]

$$\sigma_n^2 = \sigma_{AWGN}^2 + \sigma_{MP}^2 + \sigma_{MUI}^2 \qquad [1]$$

The first term in equation [1] describes the receiver noise; the second term is produced by the multi-path propagation; and the third term verifies the multi-user interferences of U other users. Aiming a perfect channel calculation, it is possible to analyze the reliability $$L_C = 2 \cdot \frac{E_s}{\sigma_n^2}$$

of the received vector elements.

Using logarithmic likelihood algebra, the MAP decoder for this block code, internal code, is expressed by the following equation:

$$L^I(\hat{u}_k) = \ln \frac{\sum\limits_{x \in C^I, u_k=+1} P(x|y)}{\sum\limits_{x \in C^I, u_k=-1} P(x|y)} \quad [2]$$

$$= \ln \frac{\sum\limits_{x \in C^I, u_k=+1} \exp\left(\frac{1}{2} \sum\limits_{i=0}^{N-1} L(x_i; y_i) \cdot x_i\right)}{\sum\limits_{x \in C^I, u_k=-1} \exp\left(\frac{1}{2} \sum\limits_{i=0}^{N-1} L(x_i; y_i) \cdot x_i\right)}$$

The values:

$$xi, yi = \begin{cases} Le \cdot y_i + L^I(U)i; & \text{for } i = \frac{1}{2^{k+1}}N; \; k = 0, \ldots, K-1 \\ Le \cdot y; & \text{otherwise} \end{cases} \quad [3]$$

describe the probability of all elements of the resulting vector, the [probability] being supplemented by input vector y with probability $L_c$ by the a-priori information $L^I(ui)$ for the K systematic bits according to the first line in equation [3] of code word $X \in C^I$, when available according to FIG. 2. The arguments of the exponential function exp( . . . ) in equation [2] are results of the correlation of the resulting vector with all Walsh functions $x_j$, j=0, . . . , N−1. This correlation operation for all code words $x_j$ is performed by applying the fast Hadamard transformation, resulting in correlation vector W'.

The a-priori information for the systematic bits of the Walsh functions is likewise made available to the decoder, if present, as L-values in vector L(u); as a result, the decoder supplies the L-values for the estimated symbols L(û). The amount $|L(\hat{u}_K)|$ indicates the reliability of the decision; the operational sign $(L(\hat{u}_K))$ represents the hard decision. The decoder result for bit $\hat{u}_k$ can be made up of three terms, as expressed by the following equation [4]:

1. of the a-priori information $L(u_k)$ about the bit to be decoded;
2. of the channel information $L_c \cdot y_{sys(k)}$ about the bit to be decoded, as well as of
3. the so-called extrinsic information $L_e(\hat{u}_k)$, in which the channel information and a-priori information on all other bits of vector y or of the transmitted Walsh function are summarized.

$$L(\hat{u}_k) = L(u_k) + L_c \cdot y_{sys(k)} + L_e(\hat{u}_k) \quad [4]$$

Since the decoder, assuming the receiving vector y with the reliability $L_c$ and the a-priori vector L(u), supplies the weighted decision $L(\hat{u}_k)$ as the decoder result for the considered symbol, the extrinsic term $L_e(\hat{u}_k)$ is able to be calculated, so to speak, as a further decoder result.

Figure 3:
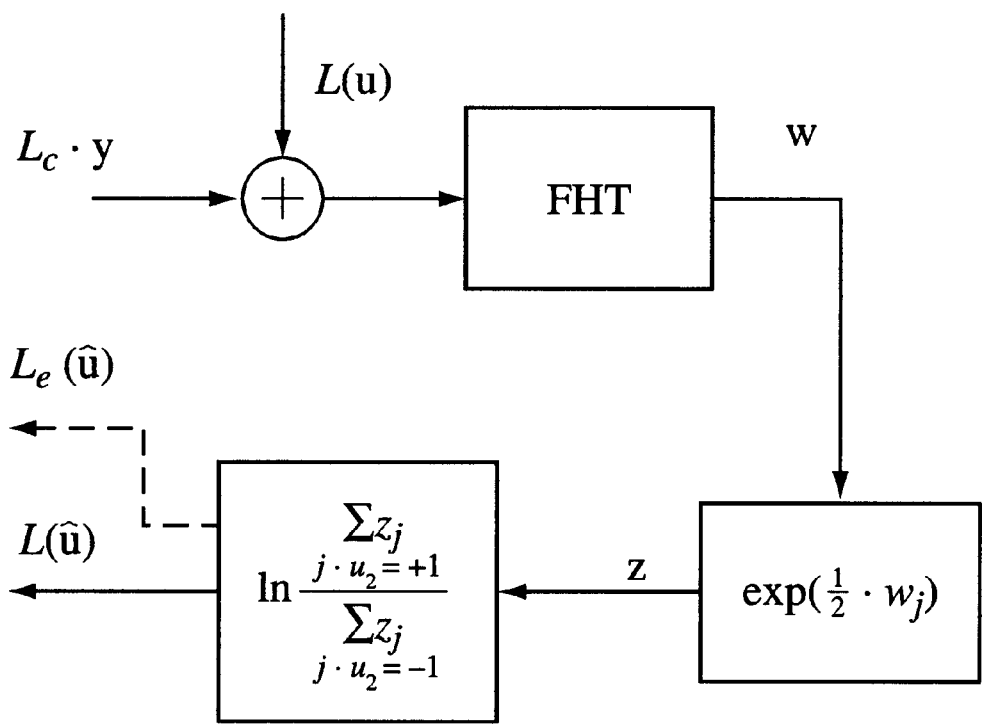
FIG. 3a decoder structure for the internal Hadamard code.

FIG. 3 depicts a decoder structure for the internal Hadamard code. With the aid of the fast Hadamard transformation, the decoding can be carried out at this point, as expressed by the equation.

$$L(\hat{u}_k) = \ln \frac{\sum\limits_{j=0, u_k=+1}^{N-1} \exp\left(\sum\limits_{i=0}^{N-1} L(x_i; y_i) \cdot \frac{1}{2} x_i\right)}{\sum\limits_{j=0, u_k=-1}^{N-1} \exp\left(\sum\limits_{i=0}^{N-1} L(x_i; y_i) \cdot \frac{1}{2} x_i\right)} \quad [5]$$

The notation with the three terms can be directly derived from this, as expressed by equation [4].

$$L(\hat{u}_k) = L(u_k) + L_c \cdot y_{sys(k)} + \ln \frac{\sum\limits_{j=0, u_k=+1}^{N-1} \exp\left(\sum\limits_{i=0, i \neq sys(k)}^{N-1} L(x_i; y_i) \cdot \frac{1}{2} x_i\right)}{\sum\limits_{j=0, u_k=-1}^{N-1} \exp\left(\sum\limits_{i=0, i \neq sys(k)}^{N-1} L(x_i; y_i) \cdot \frac{1}{2} x_i\right)} \quad [6]$$

$$L_e(\hat{u}_k)$$

The vector of the a-priori values is added to the vector of the reliability values from the channel. The addition term in equation [5] is available for all Walsh functions $x_j$ according to the fast Hadamrard transformation in vector w. After forming the exponential functions with $$\frac{1}{2} \cdot w_j;$$

as an argument, the elements of result vector z must be correctly summed for each symbol $\hat{u}_k$ to be decoded (numerator and denominator in equation [5]). The L-value of the decision is directly available through logarithm formation.

For the case that no a-priori information is available, namely when $L(u_k)=0$, the decoding instruction according to equation [5] does not change. This generally occurs when working with a first-time decoding of receiving vector y, because the coded bits $u_k$ or the symbols of the Walsh functions x, assume, with the same probability, the values "1" and "−1" and, thus, no a-priori knowledge of the transmitted symbols is available.

In this context, the AWGN channel is used as a channel model to represent the simulation results for the decoder structures introduced till now. The parameters of the hash code, as well as of the orthogonal mapping, correspond to the specifications according to the considered standard IS-95. Even the variable weighting of the maximum likelihood decision of the first decoder has an effect on the overall result.

If only the maximum terms, instead of the entire sum, are used for the numerator and denominator in equation [2], then the approximation MAP equation is reduced to a simple expression, without ln- and exp-functions, that is applied to the FHT output (correlation vector) w':

$$L(\hat{u}_k) \approx \frac{1}{2} \cdot \max_{j, u_k=+1}(w_j') - \frac{1}{2} \cdot \max_{j, u_k=-1}(w_j'). \quad [7]$$

The use of only the maximum of the values in the numerator, as well as of the maximum of the values in the denominator, is expressed as:

$$\ln \frac{\sum\limits_{j,u_k=+1}^{N-1} z_j}{\sum\limits_{j,u_k=-1}^{N-1} z_j} = \ln \frac{\sum\limits_{j,u_k=+1}^{N-1} \exp\left(\frac{1}{2} w_j\right)}{\sum\limits_{j,u_k=-1}^{N-1} \exp\left(\frac{1}{2} w_j\right)} \quad [8]$$

$$= \ln\underbrace{\left(\sum_{j,u_k=+1}^{N-1} \exp\left(\frac{1}{2} w_j\right)\right)}_{\text{Term 1}} - \ln\underbrace{\left(\sum_{j,u_k=-1}^{N-1} \exp\left(\frac{1}{2} w_j\right)\right)}_{\text{Term 2}}$$

$$\approx \ln\left(\max_{j,u_k=+1}\left[\exp\left(\frac{1}{2} w_j\right)\right]\right) - \ln\left(\max_{j,u_k=-1}\left[\exp\left(\frac{1}{2} w_j\right)\right]\right) \quad [9]$$

$$= \frac{1}{2}\max_{j,u_k=+1}[w_j] - \frac{1}{2}\max_{j,u_k=-1}[w_j]$$

This clearly reduces computational outlay.

An approximation may also be given for the application in each case of the two largest values. For term 1 of equation [8], it is expressed by $$w_{m1} = \max_{j,u_k=+1}[w_j],$$

as well as by $w_{m2}$ as the second largest value of the considered $W_j$:

$$\ln\left(\sum_{j,u_k=+1}^{N-1} \exp\left(\frac{1}{2} w_j\right)\right) \approx \ln\left(\exp\left(\frac{1}{2} w_{m1}\right) + \exp\left(\frac{1}{2} w_{m2}\right)\right)$$

$$= \ln\left(\sum_{j,u_k=+1}^{N-1} \exp\left(\frac{1}{2} w_j\right)\right)$$

$$\approx \ln\left(\exp\left(\frac{1}{2} w_{m1}\right) + \exp\left(\frac{1}{2} w_{m2}\right)\right)$$

$$= \ln\left(\exp\left(\frac{1}{2} w_{m1}\right) \cdot \left(1 + \exp\left(\frac{1}{2}(w_{m2} - W_{m1})\right)\right)\right)$$

$$= \ln\left(\exp\left(\frac{1}{2} w_{m1}\right)\right) + \ln\left(1 + \exp\left(-\frac{1}{2}(w_{m1} - w_{m2})\right)\right)$$

$$\approx \frac{1}{2} w_{m1} + e$$

where:

$$\varepsilon = \begin{cases} 0, & \text{for } W_{m1} - W_{m2} \geq 4 \ln 2 \\ \ln 2 - \frac{1}{4}(W_{m1} - Wm2), & \text{for } 0 \leq W_{m1} - W_{m2} < 4 \ln 2 \end{cases} \quad [11]$$

Figure 4:
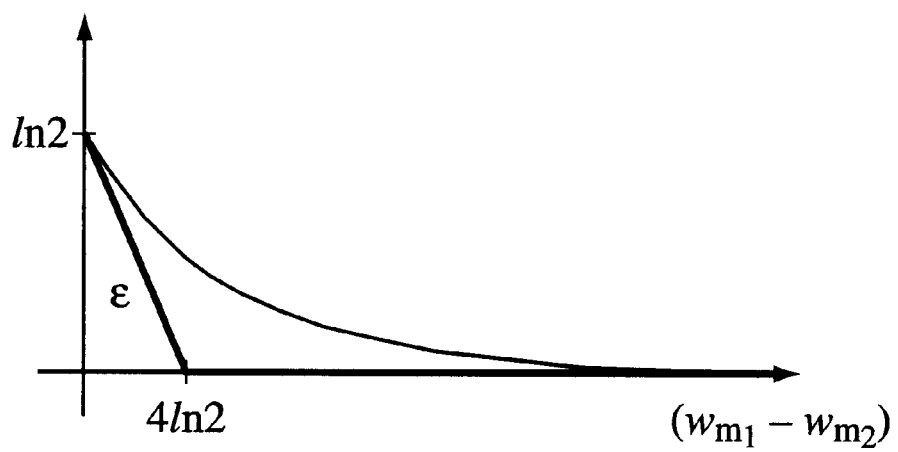
FIG. 4a clarification of the approximation for ε.

In FIG. 4, the clarification of the approximation is represented for $\epsilon$. One obtains an analogous result for term 2 in equation [8].

To obtain the a-priori information in equation [2], the external code $C^0$ is to be decoded. The conventional Viterbi decoder supplies only hard-decision values for the transmitted information bits, which is why it is replaced by a soft-decision Viterbi algorithm (SOVA), which is modified in such a way that the reconstruction is not carried out for the information bits, but rather for the coded bits of the external code (CODSOVA).

Figure 5:
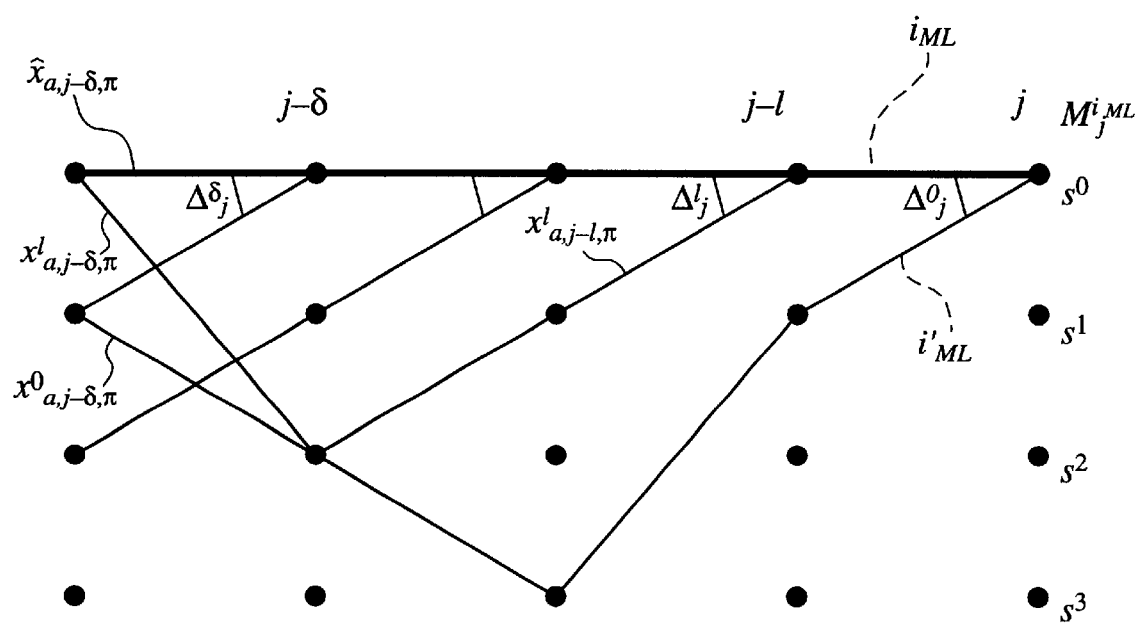
FIG. 5a Trellis diagram with rejected paths along the maximum likelihood path.

At each instant j, a Viterbi decoder makes a decision about the information bit $v_j$-δ that is preceding [took place previously] by the decision depth 67, on the basis of the maximum likelihood path, denoted $i_{ML}$, reference being made in this regard to FIG. 5, which shows a Trellis diagram with rejected paths along the maximum likelihood path.

The decision depth 67 is to be so calculated, that one can start out from the assumption that all surviving paths in the Trellis diagram at this cycling instant run together, forming one path. The rule of thumb in this context is that 67 is to be selected to be more or less five times as great as memory length m of the coder—however, not as in the example of FIG. 11.

The maximum likelihood path $i_{ML}$ at the cycling instant j is determined by the largest state metrics $$\max_v \{M_j^v\}$$

of all states $s^v$, where v=0, . . . , $2^m$–1.

The state metrics are calculated in that, initially, for each of the two possible transitions (binary Trellis) into state $S_J^V$, the current [active] branch metrics—this corresponds to the correlation value of the symbols to be decoded having the code bits of this state transition—is added to the state metrics of the previous state $S_{JV}$–1 in question. Of the two metrics values obtained in the process, the larger is selected; the other path is rejected.

[10]

Without a-priori information about the coded bits, for one binary hash code of the rate 1/N, the accumulated path metrics of path i at instant j is calculated as:

$$M_j^i = M_{j-1}^i + \sum_{n=0}^{n-1} Xa, j, n \cdot L(\hat{u}j, n) \quad [12]$$

Index i (i=0, . . . ,$2 \cdot 2^m$–1) denotes in this case all possible paths into states $S_J^V$, starting out from the $2^m$ winner paths of the $2^m$ previous states $S_J^V$–1.

Since N coded bits were produced per coding section N, for every metrics calculation according to equation (8.17), N input values must be correlated to N coded bits in conformance with the state transition under consideration. The values $L(\hat{u}_{j,n})$, where n =0, . . . , N–1 correspond directly to the reliability values of the decoder result of the previous step.

To clarify the relations, a Trellis diagram having only four states is considered by way of example in FIG. 5. At instant j, the zero path—the thicker line—is the maximum likelihood path $i_{ML}$. The loser paths along this ML path are likewise drawn in.

If, as shown in FIG. 5, $$M_j^{iLM}$$

describes the largest metrics of all states, then a difference in the metrics of this winner path $i_{ML}$ as compared to the loser path $i_{ML}$ in this state, is able to be defined:

$$\Delta_j^0 = \frac{1}{2}\left(M_j^{iML} - \left(M_j^{i'ML}\right)\right). \quad [13]$$

In this context, the superscripted index 0 denotes that this is the metrics difference at position j-0 of the ML path. The probability indicating that this path decision is correct is calculated as:

$$P(i_{ML} \text{ is right}) = \frac{\exp(M_j^{iML}/2)}{\exp(M_j^{iML}/2) + \exp(M_j^{i'ML}/2)} \quad [14]$$

$$= \frac{\exp(\Delta_j^0)}{1 + \exp(\Delta_j^0)}.$$

Accordingly, the corresponding L-value is $$L(i_{ML} \text{ is right}) = \ln\frac{P(i_{ML} \text{ is right})}{1 - P(i_{ML} \text{ is right})} = \Delta_j^0. \quad [15]$$

At this point, along path $i_{ML}$ having the largest metrics, 67 +1 loser paths are rejected. In this context, as expressed in equation [15], the metrics differences at instants j-δ. . . j indicate the reliability of the path decisions in question.

With the aid of these metrics differences, the reliability can be calculated for the information bit $L(v_j-67)$ decided upon. It is checked in this context for all decisions along the ML path whether a rejected path would have decided differently for information bit $V_j-67$ than the ML path.

When working with the soft-output Viterbi algorithm for the coded bits (COD-SOVA), an analogous procedure is used, in turn, starting from the path having maximum metrics and metric differences, to specify reliability information for the coded bits L(x̂a, j–d,n), n=0, . . . , N−1 of the state transition decided upon.

For this, it is checked for each rejected path l along the maximum likelihood path, whether the decisions $x^1_{aj-\delta,n}$, that this loser path would have made for the coded bits deviate from the decisions of the winner path. If this is the case, the probability for a correct decision $e^1_{j-d,n}=1$ on the basis of this path decision I can be defined as a function of the metrics difference $\Delta^1_j$.

$$(e^l_{j-\delta,n} = 1) = P(i_{ML} \text{ is right}|_{j-1}) = \frac{\exp(\Delta_j^l)}{1 + \exp(\Delta_j^l)} \quad [16]$$

Thus, on the basis of the path decision at j-l the L-value for the coded bit amounts to:

$$L(e^l_{j-\delta,n}) = \begin{cases} +\Delta_j^l & x^l_{a,j-\delta,n} \neq \hat{x}_{a,j-\delta,n} \quad n=0,\ldots,N-1 \\ +\infty & x^l_{a,j-\delta,n} = \hat{x}_{a,j-\delta,n} \quad n=0,\ldots,N-1 \end{cases} \quad [17]$$

In response to parity [equality] [17], the reliability value is very high, and is set to +∞. If there is a difference, then the reliability of the decision is a function of the metrics difference at instant j-l. If the path decision was very certain, given a large metrics difference, then the reliability is also quite high, in spite of different decisions of the winner and loser path. If, however, the decision was uncertain, thus the metrics difference was only somewhat greater than zero, then the reliability of this decision is likewise poor, due to different statements for the code bit being considered. The reliability of the decision made on the basis of all rejected paths, is expressed as $$L(\hat{x}_{a,j-\delta,n}) = \hat{x}_{a,j-\delta,n} \cdot \sum_{l=0}^{\delta} L(e^l_{j-\delta,n}). \quad [18]$$

The so-called "box plus" sum sign [Σ] in equation [18] signifies that of all decision variables which influence the reliability of $L(\hat{x}_{aj-\delta,n})$, the least reliable one is the one that is decisive.

If all reliability values of the decision for $\hat{x}_{aj-\delta,l}$ were greater, for example, than 1.5, and merely one L-value $(e^1_{j-\delta,1})$ were=1.5 in accordance with the metrics difference at j-l, then the decision for the code bit would be weighted accordingly with $L(\hat{x}_{aj-\delta,l}=+1)=1.5$.

Thus, in its simplest terms, equation [18] is expressed as:

$$L(\hat{x}_{a,j-\delta,n}) = \hat{x}_{a,j-\delta,n} \cdot \min_{l=0,\ldots,\delta} L(e^l_{j-\delta,n}) \quad n=0,\ldots,N-1 \quad [19]$$

This soft output $L(\hat{x}_{aj-\delta,n})$ where n=0, . . . N−1 or generally $L(\hat{x}_a)$ for the coded bits of the external hash code is now used as a-priori information L(u) for the renewed decoding of the internal code.

As an alternative to the CODSOVA, a complete MAP decoder can be used. The soft information pertaining to the calculations of the external, coded bits is used partially as a-priori information L'(u) for the systematic bits of the internal code, which are fed back; thus, a simple feeding back of the soft values to the first decoder takes place. To avoid statistical dependencies between the soft values of the various iteration steps, it is only necessary, as shown in FIG. 2, for the extrinsic information $$L_e^o(\hat{u})$$

as shown in FIG. 2, to be fed back. The system parameters for all simulations are selected in conformance with the IS-95 standard.

Figure 6:
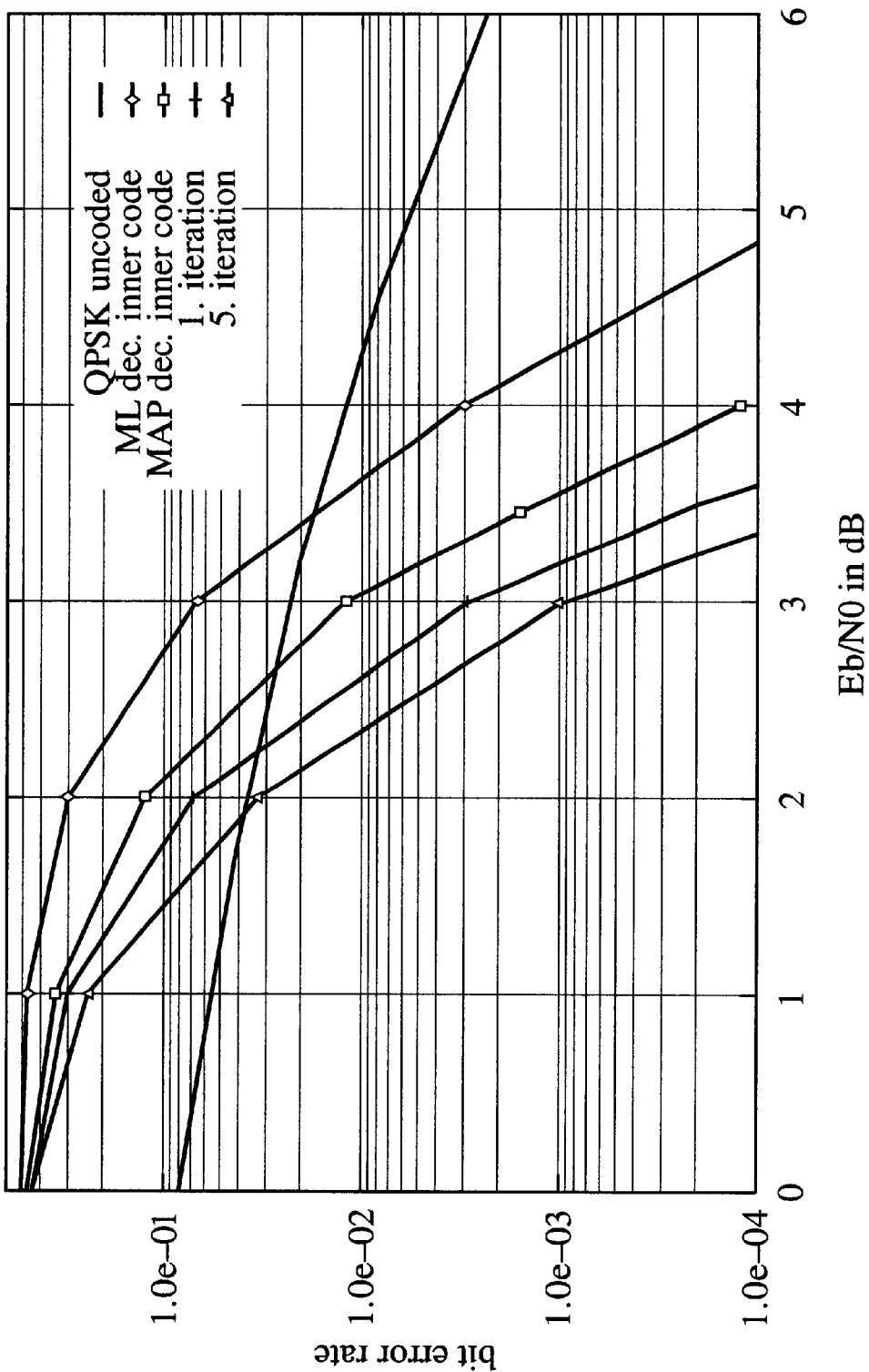
FIG. 6 the simulation results for the coherent RAKE receiver.
Figure 7:
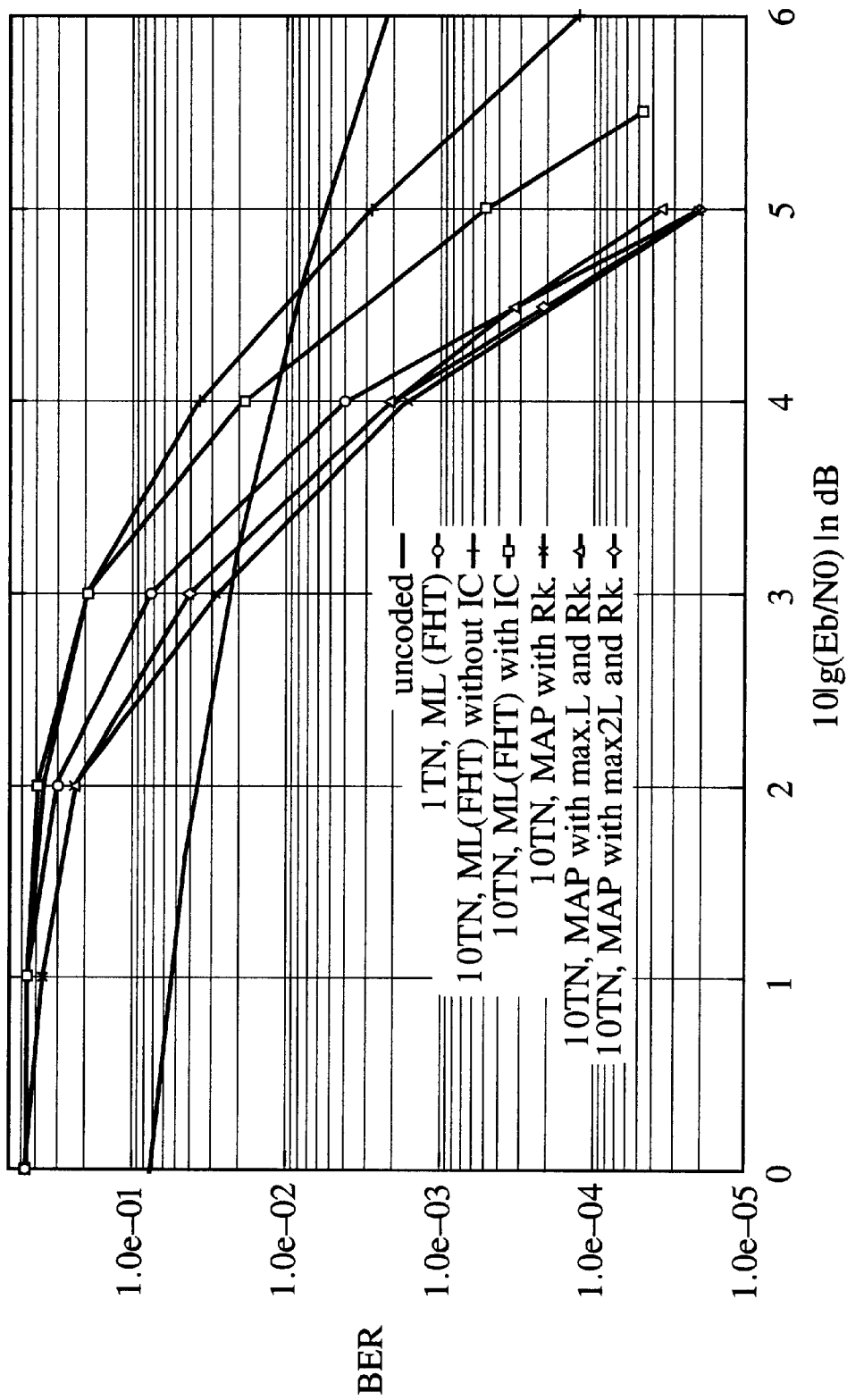
FIG. 7 a comparison of the IC to a system having MAP decoding with use of the simplification, AWGN, U=10, J$_{ges}$=128.
Figure 8:
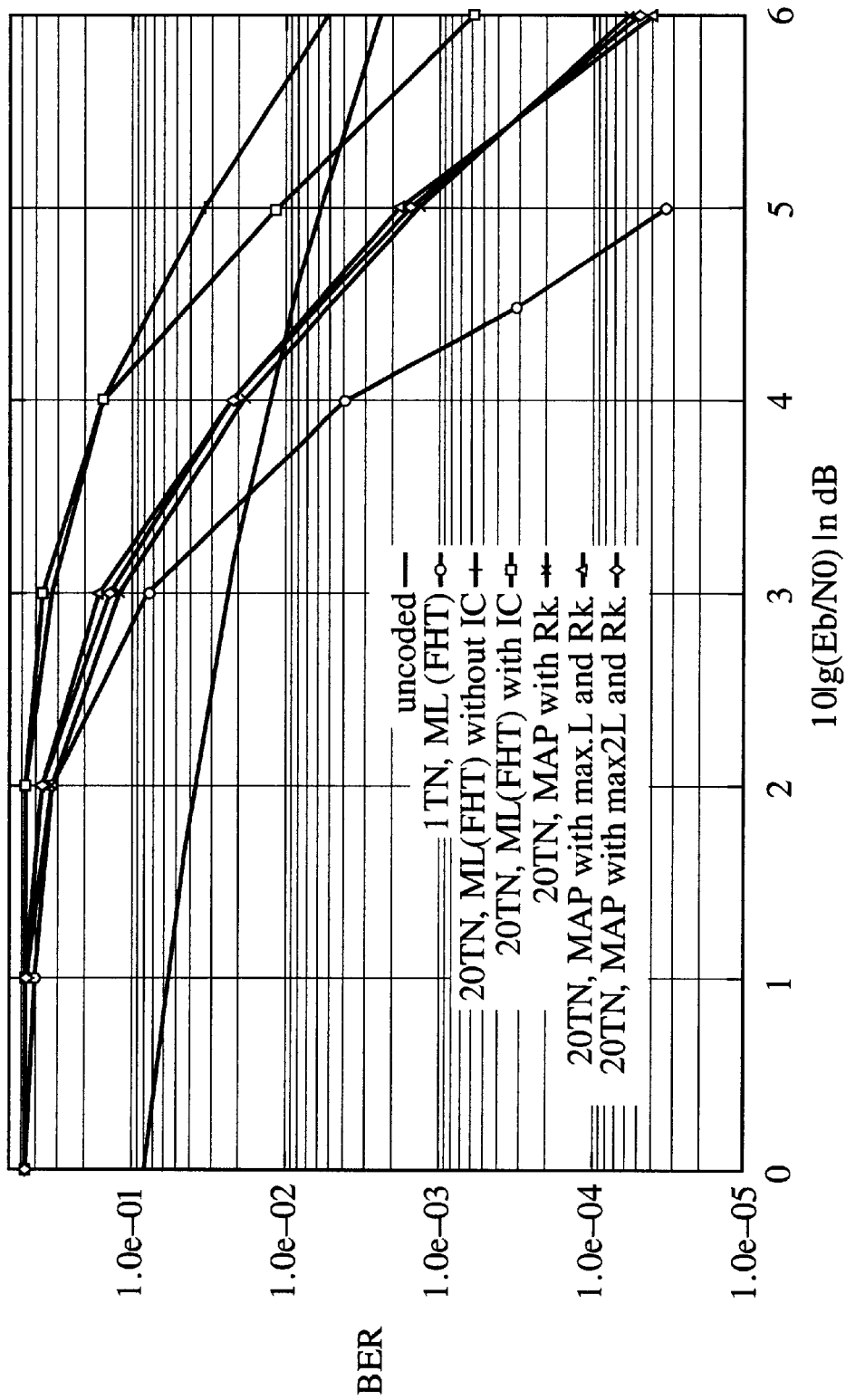
FIG. 8 a comparison of the IC to a system having MAP decoding with use of the simplification, AWGN, U=20, J$_{ges}$=128.
Figure 9:
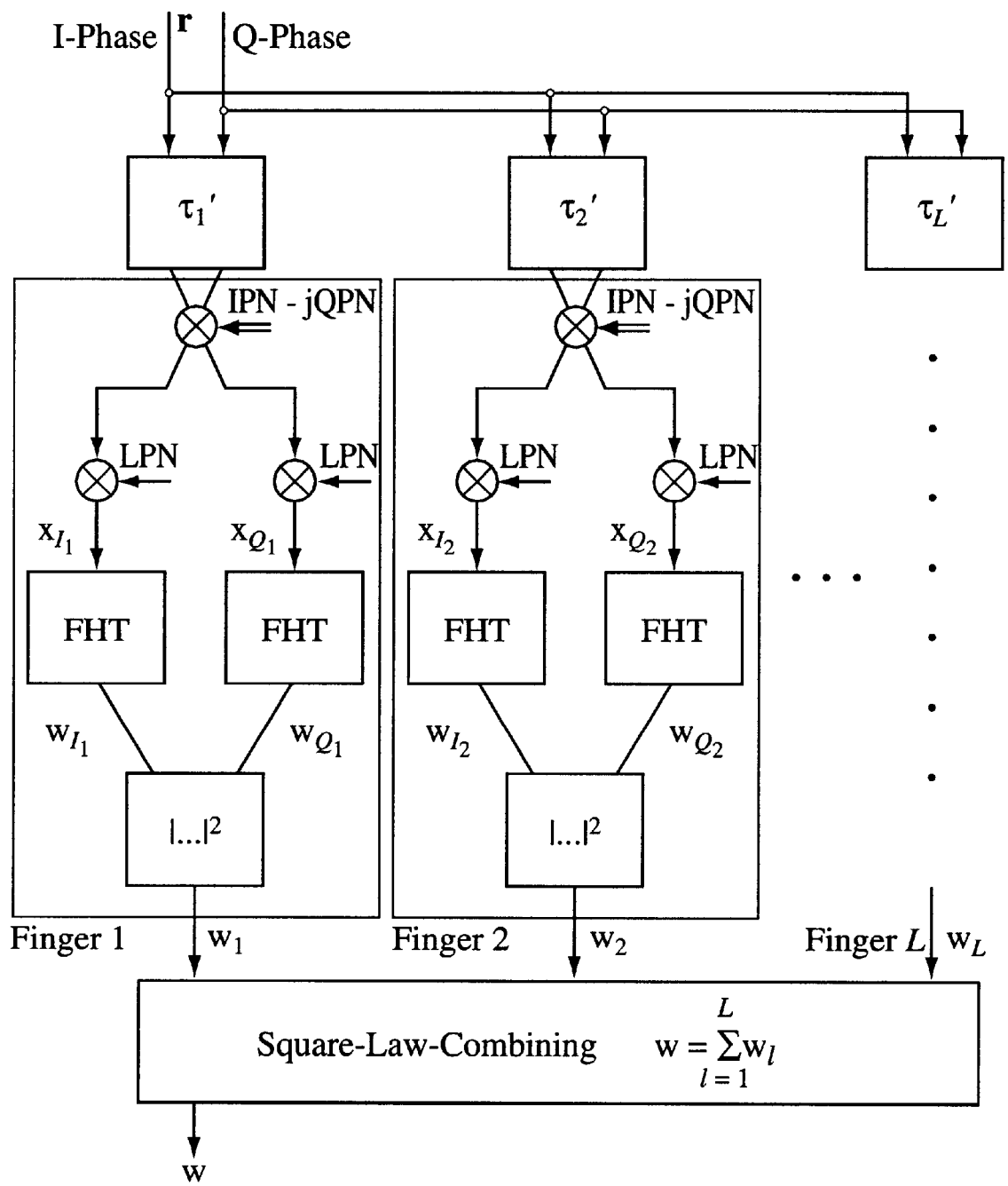
FIG. 9 a representation of the decoder structure of a non-coherent RAKE receiver having SLC.
Figure 10:
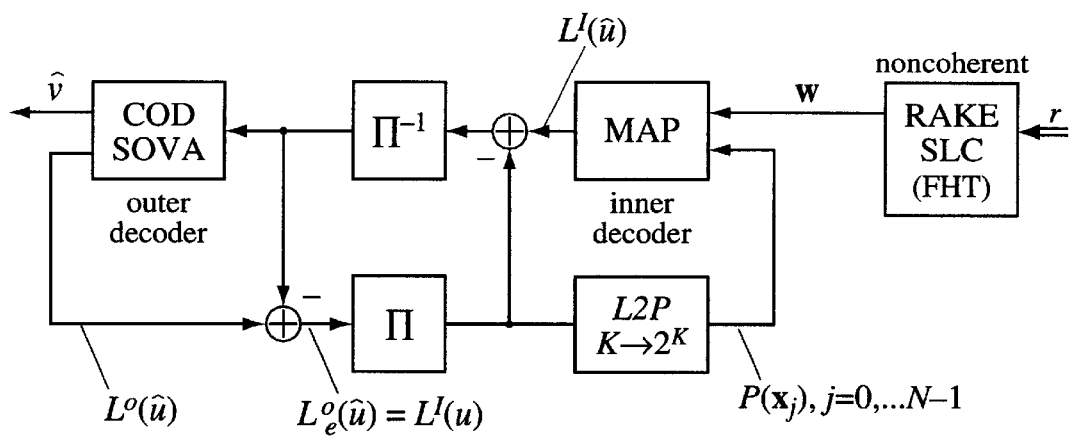
FIG. 10 the iterative decoding in the non-coherent receiver.

The simulation results for the AWGN channel (Additive White Gaussian Noise) are reproduced as a channel model in FIG. 6, which shows the simulation results for the coherent RAKE receiver. Noticeable is the gain of 0.7 dB in $E_b/N_0$ in response to the bit error rate (BER) of $10^{-3}$, when the ML decoder is replaced for the internal code by the MAP decoder according to equation [2]. Moreover, using the iterative decoding, a total gain of 1.3 dB can be achieved after five iterations. When the simple approximation is applied in equation [7], then the resulting degradation amounts to less than 0.1 dB.

The following will explain the case for MAP and iterative decoding in the non-coherent receiver.

The principal reason for using the M-fold orthogonal modulation is the possibility of demodulating the received signal without phase information. Let us assume that one starts out only from the knowledge of the delays of the multi-path channel and the iterative decoding in a non-coherent receiver having square-law combining (SLC) of the individual elements, determined according to the following FIG. 11, which illustrates a non-coherent RAKE receiver having SLC.

In each of the L-RAKE fingers, the quadrature descrambling IPN-jQPN, the direct-sequence elimination of propagation [spreading] LPN and the FHT must be performed for the in- and quadrature-phase components following compensation of the path delay. After that, the 2L correlation vectors are square-law combined, to form the decision vector w. When, in turn, a Gaussian distortion is assumed on the receiver chip for the filter outputs, then the resultant probability density function of the vector element $w_j$ is (not-) centrally chi-square distributed with 2L degrees of freedom. Under the condition that the Walsh function $x_i$ has been transmitted, then one obtains the conditional probability $$p(w_j|x_j) = p_n(w_j) \qquad [20]$$
$$= \frac{1}{2\sigma^2}\left(\frac{w_j}{s^2}\right)^{\frac{L-1}{2}} \exp\left(-\frac{w_j+s^2}{2\sigma^2}\right) \cdot I_{L-1}\left(\sqrt{w_j} \cdot \frac{s}{\sigma^2}\right)$$
for $j = i$ $$p_c(w_j) = \frac{1}{2^L \sigma^{2L}(L-1)!} \cdot w_j^{L-1} \cdot \exp\left(\frac{-w_j}{2\sigma^2}\right) \text{ for } j \neq i \qquad [21]$$

The non-centrality $S^2$ and the average noise power $\delta^2$ per random variable of the decision vector w can be estimated. The modified Bessel function $\delta^2$ of the first type and order L−1 is characterized by $I_{L-1}(.)$. For the iterative decoding, the decoder equation must be expanded so as to permit a-priori information about the systematic bits of the code word $x_j(j=0, \ldots, N-1)$ to be used. Therefore, one begins with the Bayes law and analyzes the probability $P(x_j|w)$, which results from the observation of w:

$$P(x_j|w) = \frac{P(x_j) \cdot p(w|x_j)}{p(w)} \qquad [22]$$

The probability density functions used in equation [22] can be expressed as follows:

$$p(w|x_j) = p_c(w_c) \cdot \ldots \cdot p_n(w_j) \cdot \ldots \cdot p_c(w_{N-1}) \qquad [23]$$
$$= \frac{p_n(w_j)}{p_c(w_j)} \cdot \prod_{i=0}^{N-1} p_c(w_i)$$

and $$p(w) = \sum_{j=o}^{N-1} P(x_j) \cdot p(w|x_j) \qquad [24]$$

Here, there is no limitation to the a-priori probabilities for all Walsh functions having the condition:

$$\sum_{j=o}^{N-1} P(Xj) = 1 \text{ or } P(Xj) = \frac{1}{N} \qquad [25]$$

By substituting equations [23] and [24] in equation [22], one can then analyze the maximum a-posteriori probability for all Walsh functions, observing w:

$$P(x_j|w) = P(x_j) \cdot \frac{p_n(w_j)}{p_c(w_j)} \cdot \alpha \qquad [26]$$

Constant $\alpha$ is independent of j. For the decoder rule, it is necessary to analyze the maximum a-posteriori probabilities for the K systematic bits:

$$P(\hat{u}_k = +1|w) = \sum_{x \in C^I, uk=+1} P(x|x) = \alpha \sum_{j=o, uk=+1}^{N-1} P(x_j) \cdot \frac{p_n(w_j)}{p_c(w_j)} \qquad [27]$$

In the final decoder equation, which provides a logarithm likelihood relation for the desired bit, $\alpha$ disappears:

$$L^I(\hat{u}_k) = \ln \frac{P(\hat{u}_k = +1|w)}{P(\hat{u}_k = -1|w)} \qquad [28]$$
$$= \ln \frac{\sum_{j=0, uk=+1}^{N-1} P(x_j) \cdot w_j^{-\frac{L-1}{2}} \cdot I_{L-1}\left(\sqrt{w_j} \frac{s}{\sigma^2}\right)}{\sum_{j=0, uk=-1}^{N-1} P(x_j) \cdot w_j^{-\frac{L-1}{2}} \cdot I_{L-1}\left(\sqrt{w_j} \frac{s}{\sigma^2}\right)}$$

In equation [28], it is not possible to directly use the K L-values, which are associated with the systematic bits of a Walsh function, that had been obtained by the external decoder step. As shown in this regard in FIG. 12, with respect to the non-coherent, iteratively decoding receiver, the L-values for all code words must be converted to $N=2^K$ a-priori probabilities $P(x_j)$. As in the preceding section, an approximation can be given for the right term in equation [28], in the consideration of only the maximum summands. A further simplification is possible when the Bessel function is approximated by an exponential function.

Figure 11:
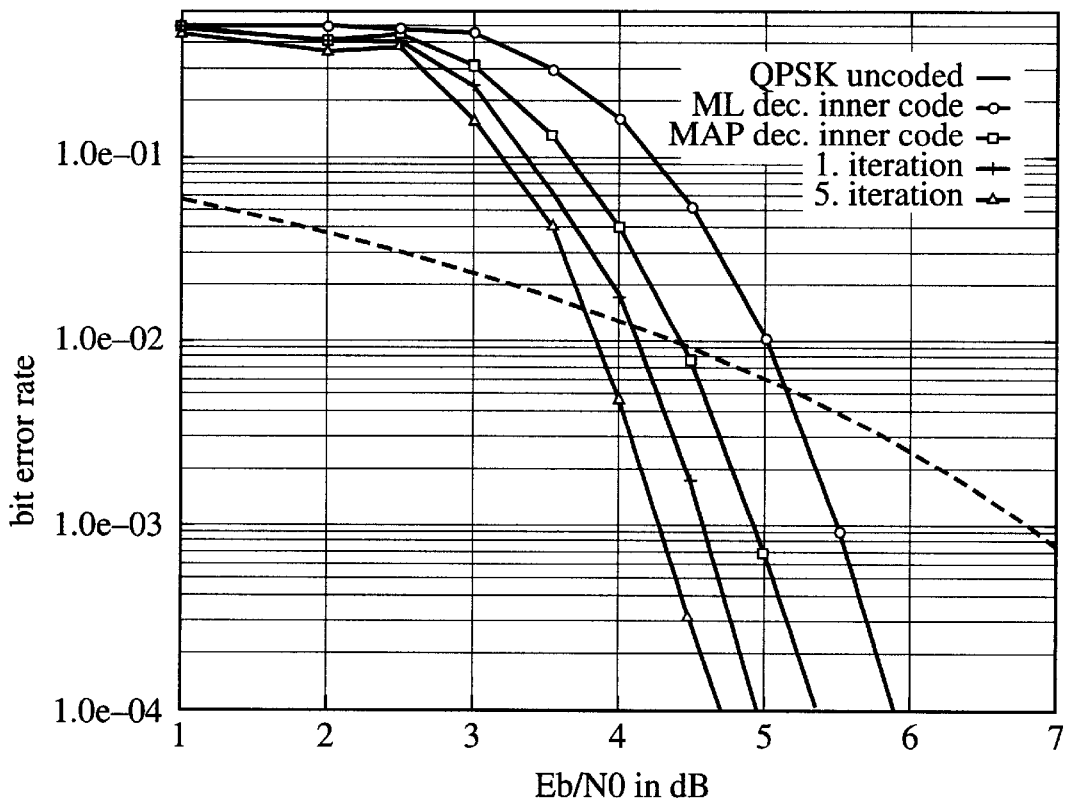
FIG. 11 the representation of the simulation results for the non-coherent RAKE receiver.

In FIG. 11, the simulation results are shown for the non-coherent RAKE receiver, AWGN channel, which show a gain of 0.6 dB (BER=$10^{-3}$) when replacing the ML decoder for the internal code by a MAP decoder. When the iterative decoding is used, a total gain of over 1.2 dB can be achieved after five iterations.

Figure 12:
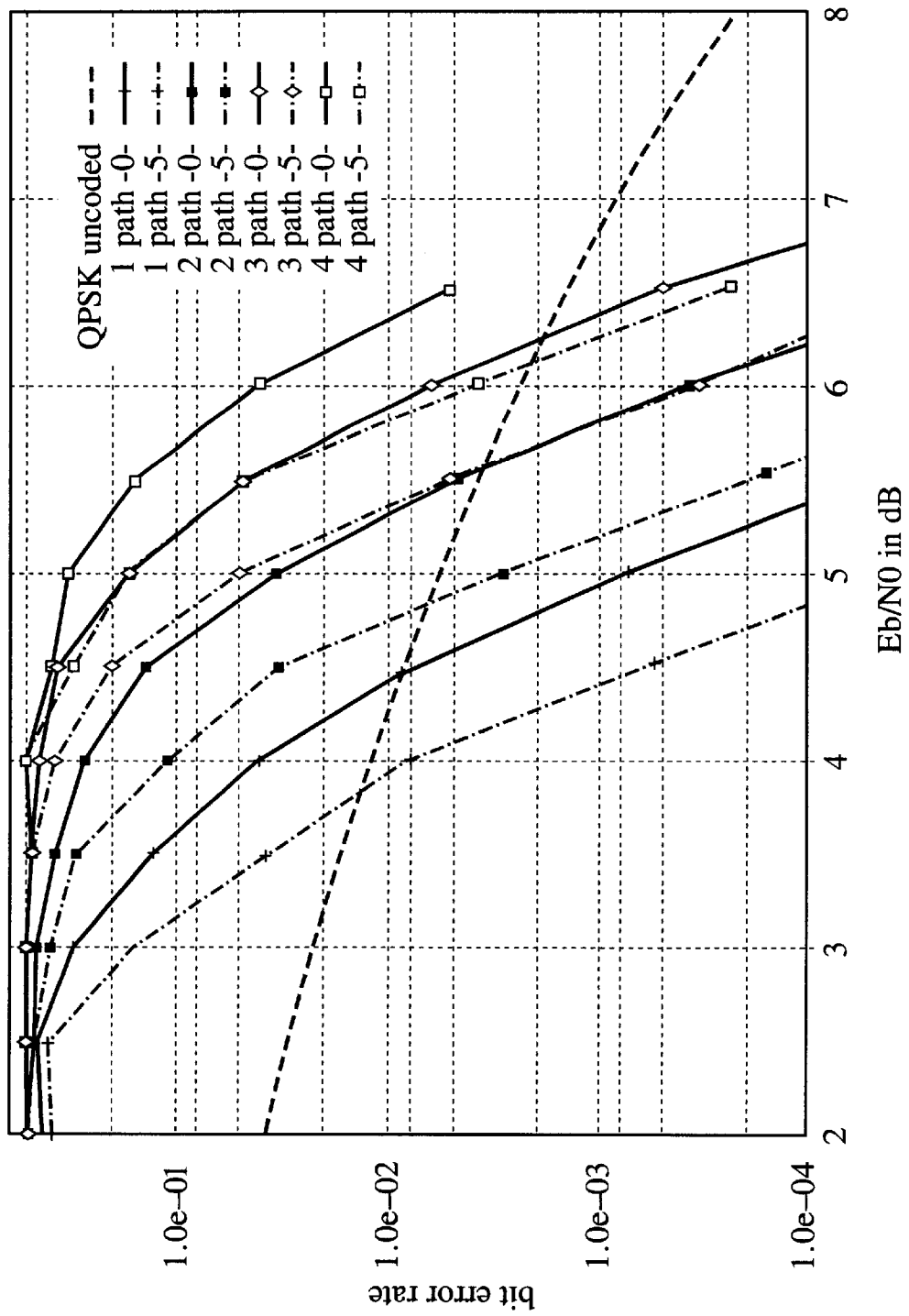
FIG. 12 the representation of the simulation results for the non-coherent RAKE receiver having a plurality of statistical multi-path channels and MAP decoding without (-0-) and after the fifth iteration (-5).

Shown in FIG. 12 are further simulation results for static multi-path channels, which represent the simulation results for the non-coherent RAKE receivers having a plurality of static multi-path channels and MAP decoding without (-0-), and after five iterations (-5-). Here, the MAP decoder algorithm was used as an external decoder. The number of RAKE fingers varies from 1 to 4 in conformance with the number of paths of the channel. The energy on the paths was uniformly distributed. Consequently, FIG. 11 shows the resulting BER after the first decoding and following five iterations. The degradation of 1 to 4 paths is caused by the addition of the squares of the individual values (square-law combining). From 1 to 2 RAKE fingers, there is a combined loss of over 1 dB, which is nearly independent of the energy distribution on the channel paths. From 2 to 3, and from 3 to 4 paths, the loss amounts to roughly 0.6 dB. The gain attained when working only with iterative decoding, amounts each time to approximately 0.6 dB (BER=$10^{-3}$).

The subject matter of the invention has industrial applicability in information and communication technology, as a result of optimal decoder rules being made available, with the use of M-fold orthogonal modulation as an internal code. This modulation scheme, in combination with an external code, can be used in a CDMA system for performing iterative decoding. The MAP decoder rules and their approximations take a-prior information into consideration, which is why they can be applied to other systems having an additional external FEC code, ie "turbo-, single-parity check" or other block codes.

What is claimed is:

1. A decoding method for demodulating a received signal available in serial code concatenation in a code-division multiple access transmission system, a two-step coding being carried out at the transmitting end of the transmission system, a first step of the two-step coding including a Hadamard orthogonal multi-step inner code, a second step of the two-step coding including an outer error-correcting code of a predefined rate, the method comprising:

providing a soft-in/soft-out decoder in a receiver of the transmission system, a first decoder step of the soft-in/soft-out decoder including an inner decoder, a second decoder step of the soft-in/soft-out decoder including an outer decoder; and processing soft values as reliability information at an output and an input of the soft-in/soft-out decoder, a soft output of the inner decoder being a soft input for the outer decoder, a channel reliability information output from a preceding demodulation being an input for the inner decoder, wherein the first decoder step of the soft-in/soft-out decoder and the second decoder step of the soft-in/soft-out decoder are configured to decode the received signal coded in the two-step coding, wherein the receiver includes an incoherent receiver structure including a RAKE receiver, wherein a soft input of the inner decoder includes a-priori information for systematic bits of Walsh functions of the inner code, the inner Hadamard code being decoded by entering an a-priori information vector L(u) into an instruction of the inner decoder, the instruction being such that for each bit decision, in a summing of a numerator and a denominator of a term to be expressed logarithmically of each considered element of a square-law-combining fast Hadamard transform resultant decision vector w, three terms are multiplied, a first term of the three terms being a-priori probabilities $P(x_j)$, a second term of the three terms being an exponentiated vector element, a third term of the three terms being a modified Bessel function of the first type of power (L-1) with argument, L being a number of fingers of the RAKE receiver, x being a Walsh function.

2. The method as recited in claim 1 wherein the entering the a-priori information vector L(u) is performed with the a-priori information vector L(u) in the form of a-priori probabilities $P(x_j)$ for Walsh functions of the Hadamard code, x being a Walsh function, u being a bit.

3. The method as recited in claim 1 wherein the decoding instruction includes the equation:

$$L(\hat{u}_k) = \ln \frac{P(\hat{u}_k = 1|w)}{P(\hat{u}_k = -1|w)}$$

$$= \ln \frac{\sum_{j=0, u_k=+1}^{N-1} P(x_j) \cdot w^{-\frac{L-1}{2}} \cdot I_{L-1}\left(\sqrt{w_j \frac{s}{\sigma^2}}\right)}{\sum_{j=0, u_k=-1}^{N-1} P(x_j) \cdot w^{-\frac{L-1}{2}} \cdot I_{L-1}\left(\sqrt{w_j \frac{s}{\sigma^2}}\right)}$$

$\hat{u}_k$ being a bit of the soft output of the inner decoder, $w_j$ being a respective element of the vector w, $I_{L-1}$ being the modified Bessel function of the first type of power L-1, j being a respective vector element index, N being a size of the code words of the inner code, s being a non-centrality of a distribution of maxima of the vector w over time, $\sigma^2$ being a mean noise power.

4. A decoding method for demodulating a received signal available in serial code concatenation in a code-division multiple access transmission system, a two-step coding being carried out at the transmitting end of the transmission system, a first step of the two-step coding including a Hadamard orthogonal multi-step inner code, a second step of the two-step coding including an outer error-correcting code of a predefined rate, the method comprising:

providing a soft-in/soft-out decoder in a receiver of the transmission system, a first decoder step of the soft-in/soft-out decoder including an inner decoder, a second decoder step of the soft-in/soft-out decoder including an outer decoder; and processing soft values as reliability information at an output and an input of the soft-in/soft-out decoder, a soft output of the inner decoder being a soft input for the outer decoder, a channel reliability information output from a preceding demodulation being an input for the inner decoder, wherein the first decoder step of the soft-in/soft-out decoder and the second decoder step of the soft-in/soft-out decoder are configured to decode the received signal coded in the two-step coding, wherein the receiver includes a coherent receiver structure, wherein a soft input of the inner decoder includes a-priori information for systematic bits of Walsh functions of the inner code, and wherein the inner code includes a Hadamard code, the Hadamard code being decoded by:

adding an a-priori information vector L(u) for systematic bits of a Walsh function of the Hadamard code to an input vector $L_c \cdot y$ from a channel;

performing a fast Hadamard transformation so as to provide a fast Hadamard transform resultant vector w;

then generating exponential functions with $\frac{1}{2} \cdot w_j$ as an argument, $w_j$ being a respective element of the vector w; and adding, dividing and expressing logarithmically elements of a result vector z for each symbol $\hat{u}_K$ to be decoded according to the equation:

$$\ln \frac{\sum_{j, u_k=+1}^{N-1} z_j}{\sum_{j, u_k=-1}^{N-1} z_j} = \ln \frac{\sum_{j, u_k=+1}^{N-1} \exp\left(\frac{1}{2} w_j\right)}{\sum_{j, u_k=-1}^{N-1} \exp\left(\frac{1}{2} w_j\right)}$$

$$= \ln \underbrace{\left(\sum_{j, u_k=+1}^{N-1} \exp\left(\frac{1}{2} w_j\right)\right)}_{\text{Term 1}} - \ln \underbrace{\left(\sum_{j, u_k=-1}^{N-1} \exp\left(\frac{1}{2} w_j\right)\right)}_{\text{Term 2}}$$

$z_j$ being a respective element of the resultant vector z, j being a respective vector element index, N being a size of the Walsh functions of the inner code;

wherein, with respect to Term 1 and Term 2 of the equation, for each step at least one maximum is used so as to provide a simplified decoder instruction of the equation, the simplified decoder instruction expressed by the relation:

$$\approx \ln\left(\max_{j, u_k=+1}\left[\exp\left(\frac{1}{2} w_j\right)\right]\right) - \ln\left(\max_{j, u_k=-1}\left[\exp\left(\frac{1}{2} w_j\right)\right]\right)$$

$$= \frac{1}{2} \max_{j, u_k=+1} [w_j] - \frac{1}{2} \max_{j, u_k=-1} [w_j]$$

so that $$L^I(\hat{u}_k) \cong \frac{1}{2} \cdot \max_{j, u_k=+1} (w'_j) - \frac{1}{2} \cdot \max_{j, u_k=-1} (w'_j),$$

$w_j$ being a respective element of the vector w, $L^I(\hat{u}_k)$ being the soft output of the inner decoder, u being a bit, y being a vector.

* * * * *